United States Patent
Sinha et al.

(10) Patent No.: US 8,531,083 B2
(45) Date of Patent: Sep. 10, 2013

(54) DEVICES HAVING A TUNABLE ACOUSTIC PATH LENGTH AND METHODS FOR MAKING SAME

(75) Inventors: Rajarishi Sinha, Pittsburgh, PA (US); L. Richard Carley, Sewickley, PA (US); Deok-Yang Kim, New Brunswick, NJ (US)

(73) Assignee: Resonance Semiconductor Corporation, Pittsburgh, PA (US)

( * ) Notice: Subject to any disclaimer, the term of this patent is extended or adjusted under 35 U.S.C. 154(b) by 906 days.

(21) Appl. No.: 12/391,490

(22) Filed: Feb. 24, 2009

(65) Prior Publication Data
US 2009/0289526 A1 Nov. 26, 2009

Related U.S. Application Data

(60) Provisional application No. 61/067,192, filed on Feb. 25, 2008.

(51) Int. Cl.
*H01L 41/08* (2006.01)
(52) U.S. Cl.
USPC ............ 310/320; 310/311; 310/325; 310/326
(58) Field of Classification Search
USPC ................. 310/320, 322, 325, 326, 328, 311, 310/366, 331, 327; 333/191, 195, 189, 187, 333/196
IPC ............................................ H01L 41/08, 41/09
See application file for complete search history.

(56) References Cited

U.S. PATENT DOCUMENTS 6,114,797 A 9/2000 Bishop et al.
6,534,900 B2 * 3/2003 Aigner et al. ................. 310/326

(Continued)

FOREIGN PATENT DOCUMENTS

| JP | 2009026994 A | 2/2009 |
|---|---|---|
| KR | 20020065206 A | 8/2002 |
| KR | 20050072565 A | 7/2005 |
| WO | 2006/004470 | 1/2006 |

OTHER PUBLICATIONS

S.Gevorgian and A. Vorobiev, "dc field and temperature dependent acoustic resonances in parallel-plate capacitors based on SrTiO3 and Ba0 25Sr0.75TiO3 films: Experiment and modeling", Journal of Applied Physics 99, 124112 (2006).
John Berge, Andrei Vorobiev, William Steichen, and Spartak Gevorgian, "Tunable Solidly Mounted Thin Film Bulk Acoustic Resonators Based on BaxSr1-xTiO3 Films", EEE Microwave and W~Eless Components Letters, vol. 17, No. 9 Sep. 2007 655.

(Continued)

*Primary Examiner* — Thomas Dougherty
*Assistant Examiner* — Karen B Addison
(74) *Attorney, Agent, or Firm* — Lerner, David, Littenberg, Krumholz & Mentlik, LLP

(57) ABSTRACT

A tunable acoustic resonator device has a piezoelectric medium as a first thin film layer and a tunable crystal medium as a second thin film layer. The tunable crystal medium has a first acoustic behavior over an operating temperature range under a condition of relatively low applied stress and a second acoustic behavior under a condition of relatively high applied stress. The acoustic behaviors are substantially different and, consequently, the different levels of applied stress are used to tune the acoustic resonator device. Compared with the tunable resonator device consisting of only tunable crystal medium, a device having both the piezoelectric and tunable crystal medium has advantages such as larger inherent bandwidth and less nonlinearity with AC signals. The device also requires a smaller applied stress (i.e. bias voltage) to achieve the required frequency tuning.

32 Claims, 9 Drawing Sheets

(Cross-section)

(56) References Cited

U.S. PATENT DOCUMENTS

| | | |
|---|---|---|
| 6,747,529 B2 | 6/2004 | Abe et al. |
| 7,122,939 B2 | 10/2006 | Chou et al. |
| 7,586,391 B2 * | 9/2009 | Volatier et al. ............. 333/188 |
| 7,687,970 B2 * | 3/2010 | Bosch et al. ................ 310/311 |
| 7,687,971 B2 * | 3/2010 | Stokes et al. ............ 310/313 B |
| 7,956,705 B2 | 6/2011 | Meister et al. |
| 7,973,620 B2 | 7/2011 | Shirakawa et al. |
| 2003/0102775 A1 | 6/2003 | Fujimura et al. |
| 2005/0285476 A1 | 12/2005 | Chou et al. |
| 2010/0272214 A1 | 10/2010 | Wurm et al. |
| 2010/0277237 A1 | 11/2010 | Sinha et al. |

OTHER PUBLICATIONS

G.N. Saddik, D. S. Boesoh, S. Stemmer, and A. A. York "dc electric field tunable bulk acoustic wave solidly mounted resonator using SrTiO3", Applied Physics Letters 91, 043501 (2007).

Xinen Zhu, Jamie D. Phillips, and Amir Mortazawi "A DC Voltage Dependant Switchable Thin Film Bulk Wave Acoustic Resonator Using Ferroelectric Thin Film", Department of Electrical Engineering and Computer Science, University of Michigan, Ann Arbor, MI 48109, USA, pp. 671-674.

International Search Report, PCT/US2010/000226, dated Jan. 26, 2010.

* cited by examiner

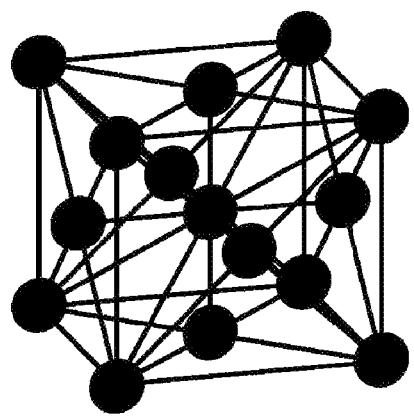
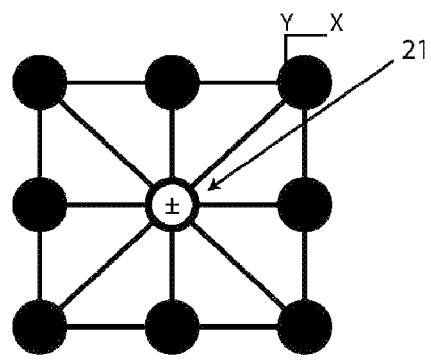
FIG. 1A        FIG. 1B
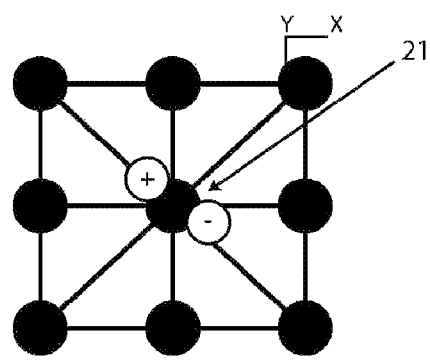
FIG. 1C

US 8,531,083 B2

DEVICES HAVING A TUNABLE ACOUSTIC PATH LENGTH AND METHODS FOR MAKING SAME

CROSS-REFERENCE TO RELATED APPLICATIONS

This application claims the benefit of the filing date of U.S. Provisional Patent Application No. 61/067,192 filed Feb. 25, 2008, the disclosure of which is hereby incorporated herein by reference.

BACKGROUND OF THE INVENTION

This invention relates to devices to frequency variable devices that incorporate a piezoelectric thin film resonator.

Crystal media capable of coupling mechanical and electrical signals have found application in many useful devices, e.g. producing a voltage in response to mechanical stress or vice versa. Piezoelectric crystals are a well-known group of such materials. Examples of materials which may have piezoelectric properties include aluminum nitride (AlN), zinc oxide (ZnO), Quartz ($SiO_2$) etc. Piezoelectric materials may be characterized as having a permanent fixed charge in the crystal structure thereof, which may be thought of as electrical domains in alignment. Conventional piezoelectric materials suffer from a number of drawbacks which limit their application in certain types of devices. Since the electrical orientation of a piezoelectric material is fixed, it cannot be turned off and a switch is required to disconnect the device from the rest of the circuit. Such switches are not desirable in RF circuits, since the use of switch networks entails energy loss, increased device complexity, and cost. In an acoustic resonator device, where it is desired to use an electric field to alter acoustic wave propagation in the material, applying an electric field only changes the electromechanical coupling (and hence the acoustic velocity) by a modest amount in conventional piezoelectric materials because the materials have a permanent electric field. Consequently, it is not efficient to use an external electric field to significantly tune the acoustic velocity and electromechanical coupling coefficient of these resonators. A subset group of piezoelectric crystal media, generally referred to as displacive ferroelectric materials, exhibits induced piezoelectricity with the application of an external stress (such as a DC bias voltage). Displacive ferroelectric materials differ from piezoelectric materials in that these materials do not exhibit piezoelectric behavior unless an external stress is applied to induce such behavior in the material. This is because, unlike conventional piezoelectric materials (which are used in a variety of device contexts such as, for example, resonators), these displacive ferroelectric materials have no net displacement of charge in their crystal structure in their paraelectric state.

In displacive ferroelectric materials, an applied DC bias causes an incremental change in the strain of these materials by creating non-centrosymmetry in the crystal structure that can be interpreted as a change in the stiffness matrix for the material. This change in the stiffness (or elastic constant) of materials also induces the change of acoustic velocity inside of materials by the following known expression:

$V_{ac}$ (acoustic velocity)=SQRT ($c33/\rho$); where $\rho$ is the density of the material and $c33$ is the elastic constant. Rosenbaum, J. F., *Bulk Acoustic Wave Theory and Devices*, (1988).

The acoustic path length is the distance traversed by an acoustic wave of a specified velocity through the material. Eventually, the applied DC bias voltage causes a change in the acoustic path length of the material.

The aforementioned properties may be found in perovskite crystals having the general chemical formula $ABO_3$, for example $SrTiO_3$ as shown in FIG. 1A. Due to the mismatch in the sizes of the two cations A and B, small distortions in the lattice occur to minimize the lattice energy. If these distortions are asymmetric, a small residual charge displacement in the crystal structure will result. In the piezoelectric state, the crystal is formed in such a way that the charge displacement is permanent. In the paraelectric state, on the other hand, there is no net displacement of charge in the absence of a DC bias; the centers of positive and negative charge coincide at the center 21 of the crystal, as shown in FIG. 1B. When a DC bias is applied (e.g. an external electric field), the positive and negative charge centers separate slightly, as shown in FIG. 1C. Accordingly, these displacive ferroelectric materials in the paraelectric state do not store a permanent charge. Application of an external stress (such as a DC electric field) generates a static charge displacement.

However, not every displacive ferroelectric material is optimal for bias-induced acoustic path and piezoelectric tuning. For example, Gevorgian and Vorobiev, *J. Appl. Phys.*, Vol. 99, p. 124112 (2006) describes a thin film bulk acoustic resonator (TFBAR) using $SrTiO_3$ or $Ba_{0.25}Sr_{0.75}TiO_3$ as the paraelectric that is biased to obtain piezoelectric behavior. Further, the same group in Berge et al. (*IEEE Microwave and Wireless Components Lett.*, 17(9):655-657, September 2007) extend the previous work to solidly mounted resonators (SMR) using $BaTiO_3$ or $Ba_{0.25}Sr_{0.75}TiO_3$ as the tunable piezoelectric layer. Another group, Saddik et al., *Appl. Phys. Lett.*, Vol. 91, 043501 (2007) describes a SMR using $SrTiO_3$ as the paraelectric material that is biased to obtain piezoelectric behavior. International Patent #WO 2006/004470 A1, published on 12 Jan. 2006, describes the tunable FBAR structure described above in Gevorgian and Vorobiev. U.S. Pat. No. 6,747,529, describes TFBAR and SMR structures with the epitaxial ferroelectric $BaTiO_3$ as the tunable piezoelectric layer. $BaTiO_3$ is a material that is piezoelectric even without an externally applied bias. These references use electrical bias and tuning to place a paraelectric material into piezoelectric operation. However, this approach is subject to several flaws and drawbacks:

1) Bandwidth. The performance of such devices is limited by the achievable bandwidth of the tunable material. Typically, it is seen that this bandwidth is of the order of 1-3% in TFBARs.
2) Nonlinearity. The tuning behavior of these materials in inherently nonlinear; when they are subject to an AC voltage, the resonance frequency of the device changes during operation. This can cause undesirable overtones to be generated in the output of the device.
3) DC Bias Voltage. Even though small bias voltages will induce piezoelectric behavior, the resulting small electromechanical coupling coefficient ($k^2$) of the resonator will be practically unusable. To obtain useful values of $k^2$, it would become necessary to use large bias voltages, which are difficult and expensive to generate. High bias voltages can also significantly reduce the lifetime of devices.

Another patent, U.S. Pat. No. 6,534,900 describes TFBAR and SMR structures that use electrostrictive polymers and non-polar ceramics as their electroactive tuning layer. However, these materials suffer from the same drawbacks of other paraelectric materials noted above. Additionally, polymeric materials can suffer from significant hysteresis.

It should be noted that in a paraelectric state, the sign of the coupling between the incremental voltage and the strain may be reversed by reversing the sign of the bias voltage. This property clearly distinguishes paraelectric materials from piezoelectric materials. It follows that in paraelectric state, the strength of the coupling between mechanical and electrical signals can be modulated, reduced to zero, or even have its sign reversed. Since paraelectric materials do not have a net displacement of charge in the absence of an applied stress (or applied electric field), they tend to be more rugged than piezoelectric materials in high-temperature or high-power environments.

Despite the above noted deficiencies in the performance of resonator devices that utilize such materials, it remains desirable to exploit the distinct properties of paraelectric materials as electromechanical and/or electro-acoustic transmissive layers.

SUMMARY OF THE INVENTION

A device is described herein that includes a layer exhibiting paraelectric behavior over an operating temperature range under a condition of applied stress below a certain threshold and piezoelectric behavior under a condition of applied stress at or above a certain threshold. The paraelectric layer is preferably a displacive ferroelectric material. The amount of the stress required to adjust the acoustic path length of the material is a function of the material thickness. This varies from material to material. However, typically, very high stresses (e.g. high voltages) are required to shift the acoustic path length of materials having a thickness in excess of 50 μm. In order to provide a device with a rapid response time at low voltage (e.g. 3 volts or less), it is advantageous if the paraelectric layer is formed as a thin film with a thickness equal to or less than about 50 μm. If a particular design calls for a paraelectric layer in excess of 50 μm, the paraelectric layer can be divided into multiple layers, separated by electrodes and each having the desired thickness of 50 μm or less. This enables the individual paraelectric layers to provide the desired tuning to the device at the desired low voltage.

In operation, the paraelectric layer generally has a substantially centrosymmetric charge structure under the low-stress condition (that is, the material exhibits paraelectric behavior below the applied stress threshold), and a substantially non-centrosymmetric charge structure under the high-stress condition (that is, the material exhibits piezoelectric behavior at or above a certain threshold). The threshold of applied stress for inducing piezoelectric behavior in a paraelectric material is material dependent and depends upon other factors as well (e.g. temperature, layer thickness, etc.). In a case where the paraelectric layer has an electric field applied thereto, the paraelectric layer is characterized by an internal electric field in the absence of the applied field, with the internal electric field having a magnitude less than that of the applied field. Under the condition of relatively high applied stress, the paraelectric material may have piezoelectric polarization in a direction associated with the applied stress. The applied stress may be an electric field applied across the paraelectric layer, a magnetic field applied across the paraelectric layer, a mechanical stress applied across the paraelectric layer, a mechanical strain applied across the paraelectric layer, or a temperature applied across the paraelectric layer.

According to certain embodiments described herein, the paraelectric layer overlies a supporting substrate. Substrate, as used herein, is any suitable supporting structure that does not act as a sink to the acoustic energy of the device. Examples of suitable substrates include silicon substrates with a void such as a hole or trench over which the device is suspended. For example, the device may be supported by beams having a metal-insulator-metal (MIM) structure, to provide mechanical and acoustic isolation from the substrate. In other embodiments the device is formed on a Bragg structure formed over an otherwise rigid supporting substrate (e.g. a silicon wafer). Exemplary Bragg structures are described in commonly owned patent application Ser. No. 12/002,524 entitled "INTEGRATED ACOUSTIC BANDGAP DEVICES FOR ENERGY CONFINEMENT AND METHODS OF FABRICATING SAME," filed on Dec. 17, 2007, which is incorporated by reference herein. One skilled in the art is aware of many substrate configurations that can support an acoustically resonant device and all such substrates are not described in detail herein.

The device may also include a plurality of electrodes overlying the substrate, with the paraelectric layer sandwiched between a pair of electrodes. The device further comprises a layer of piezoelectric material, also sandwiched between two electrodes. In certain embodiments, there is one electrode sandwiched between the paraelectric layer and the piezoelectric layer. The electrodes that bracket the paraelectric layer are adapted to receive an applied electric potential, so that a potential difference can be applied across the layer of crystal medium in the stack. The electrodes that bracket the piezoelectric material are used to control the transducer function of the piezoelectric material. The electrodes that bracket the paraelectric layer are used to apply a DC bias across the paraelectric layer that will affect the acoustic delay of the signal coupled into (or out of) the paraelectric layer.

When the device has a bias applied thereto, it may be characterized as an electromechanical transducer. In particular, the sign of electromechanical transduction performed by the device may be selectable in accordance with placement and magnitude of the bias, and the polarization gradient in the device may vary in accordance with a spatial distribution of the bias. The one (or more, if present) layers of the paraelectric layer are responsive to potential differences resulting from electric potentials applied to the electrodes, so that series or parallel mechanical resonances of the layers are selectively tunable; the primary resonance of the device may be in a thickness mode, a lateral mode or a shear mode or any other resonant mode.

According to another aspect of the invention, the paraelectric material layer forms part of an acoustic resonator. The paraelectric layer has a bias applied thereto so as to induce electromechanical coupling therein, and the resonator has a characteristic center frequency which is tunable in response to variations in the bias. The resonator may include a plurality of paraelectric layers, with the first and second layers being tunable in response to separate applied potential differences, so as to permit tuning of series resonances respectively. The resonator may also be a thin film device having electrodes and metal leads connecting to the electrodes, with the bottom electrode in contact with the substrate only through the leads, so as to provide the desired acoustic isolation between the resonator and the substrate.

In certain embodiments, a high quality piezoelectric such as aluminum nitride (AlN), zinc oxide (ZnO), lead zirconate titanate (PZT) etc., is used to perform the transduction function in the devices described herein. The paraelectric layer is placed adjacent to the piezoelectric material so that the acoustic behavior of the entire structure is tunable with bias voltage. This allows the use of the high $k^2$ of these piezoelectrics, takes the nonlinear paraelectric material out of the RF electrical path, and allows the use of thinner paraelectric layers (i.e. 50 μm or less) and hence permits the use of lower bias voltages to shift the overall acoustic path length of the entire device.

Among the many desirable material characteristics sought for the resonator material for use in room-temperature, electric field-tunable acoustic wave operation at MHz-GHz frequencies are the following:
1) A highly field-polarizable and lattice-deformable high-symmetry structure with large field-dependent effects persisting to bias fields of order 100 MV/m.
2) An absence of hysteresis when cycling to bias fields of this magnitude;
3) An efficient coupling of the resulting field-induced piezoelectricity to longitudinal acoustic vibrations; and
4) Low acoustic and dielectric losses (i.e. high Q-values) at the operational bias-field and frequency.

Condition one asks for materials with as large a dielectric response (permittivity) as possible (above 100 at zero bias). Condition two requires the phase transition temperature from paraelectric state to ferroelectric state to be in the temperature range of about 150 K to 250 K.

BRIEF DESCRIPTION OF THE DRAWINGS

FIG. 1A illustrates a typical perovskite crystal structure (prior art).

FIG. 1B shows a paraelectric crystal with the structure of FIG. 1A, without an applied DC bias (prior art).

FIG. 1C shows a paraelectric crystal with the structure of FIG. 1A, with an applied DC bias (prior art).

DETAILED DESCRIPTION OF PREFERRED EMBODIMENTS OF THE INVENTION

The displacive ferroelectric materials shown in these embodiments are either non-piezoelectric in their quiescent state, or have negligible piezoelectric behavior. These material in the devices described herein is preferably (but not exclusively) a perovskite crystal of the form $ABO_3$. Examples of these materials include barium strontium titanate ($Ba_xSr_{1-x}TiO_3$), lead strontium titanate ($Pb_xSr_{1-x}TiO_3$), strontium titanate ($SrTiO_3$), potassium tantalate ($KTaO_3$), calcium titanate ($CaTiO_3$), barium zirconium titanate ($Ba_xZr_{1-x}TiO_3$), barium titanate stanate ($BaSn_xTi_{1-x}O_3$), potassium tantalate niobate ($KNb_xTa_{1-x}O_3$) and rubidium potassium niobate ($Rb_xK_{1-x}NbO_3$). It should be noted that different crystal materials exhibit paraelectric behavior over different temperature ranges. The material thus may be selected so that the device has an operating temperature range suitable for the application (e.g. automotive applications where the desired temperature range is from about −85° C. to about +125° C.).

Figure 2:
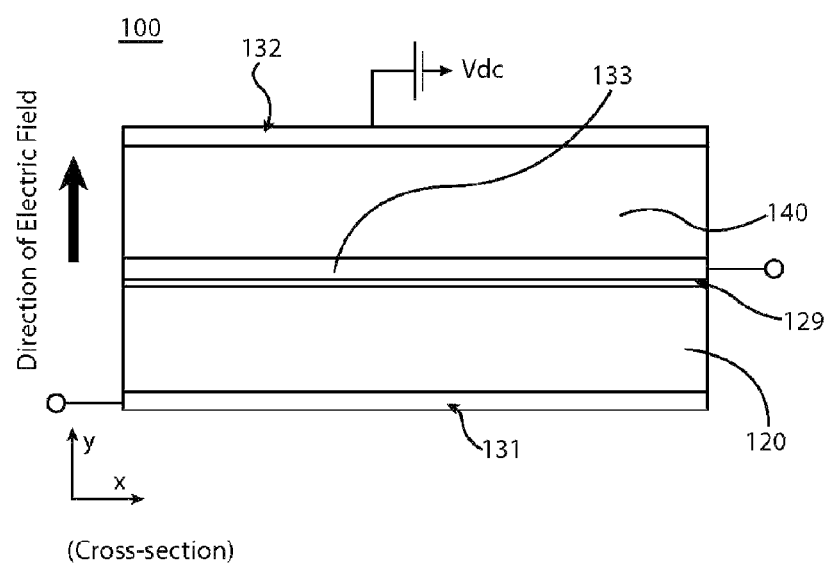
FIG. 2 is a schematic illustration of a device having separate transduction and tuning layers, in accordance with an embodiment of the invention.

A tunable transducer, having separate tuning and transduction layers in accordance with an embodiment of the invention, is shown schematically in FIG. 2. Device 100 has a piezoelectric layer 120 and a paraelectric layer 140 for transduction and tuning respectively, with top and bottom electrodes 131, 132 and a middle electrode 133 separating the piezoelectric layer from the paraelectric layer. As shown in FIG. 2, the transduction layer is biased so that an electric field is present in the layer. The device is tuned by separately biasing the tuning layer 140. A change in bias will shift the acoustic path length in the tuning layer. The change in acoustic path length can change the center resonant frequency of the device 100. An optional temperature compensating layer, e.g. oxide layer 129, is formed on top of piezoelectric layer 120. This optional layer is used to provide a gross compensation in the temperature coefficient of frequency of the device 100. Middle electrode 133 is formed on the insulating layer 129.

Figure 2A:
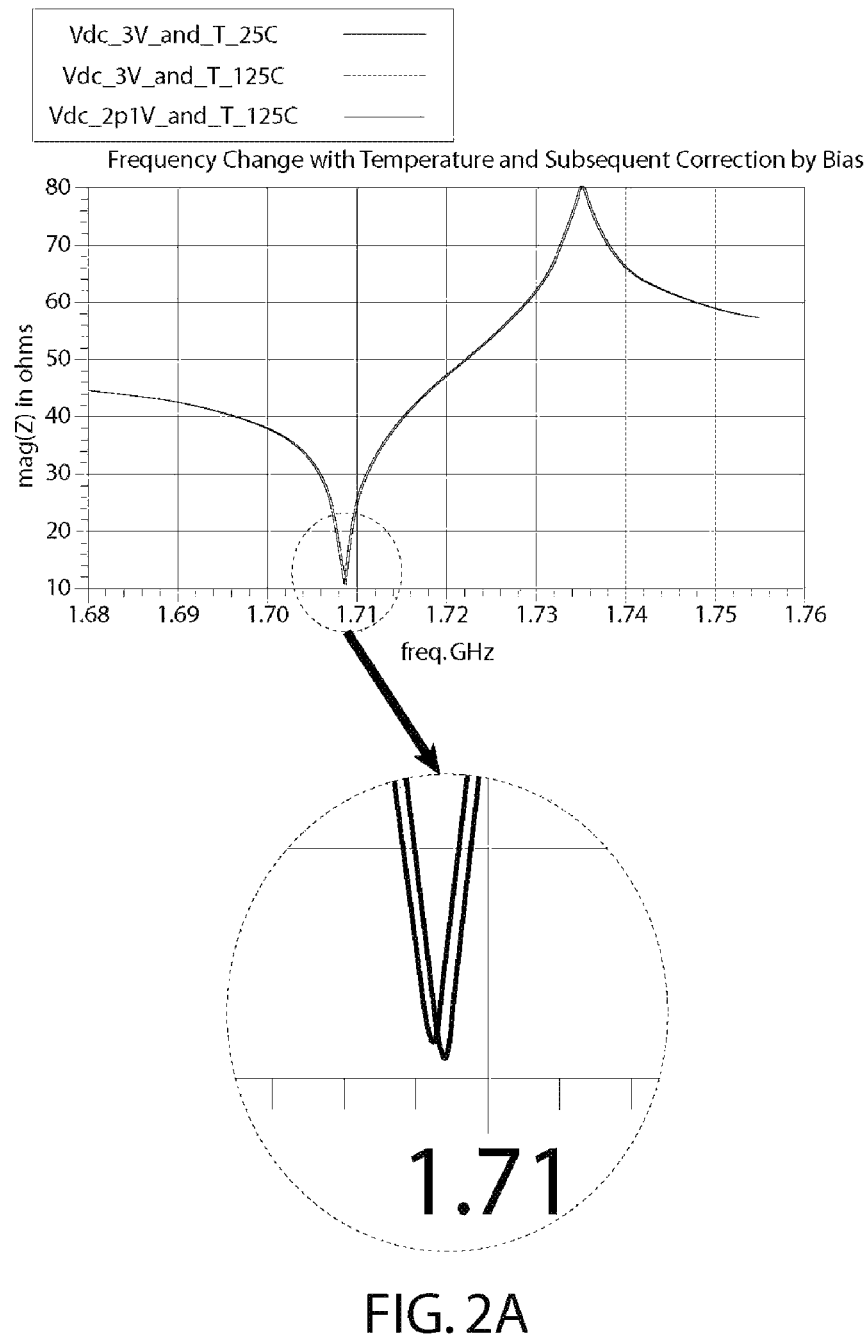
FIG. 2A illustrates the operation of the device illustrated in FIG. 2.

Applying and removing the bias voltage causes the acoustic path length through the paraelectric material 140 to change with a response time on the order of nanoseconds. Referring to FIG. 2A, a change in the center frequency of the device 100 results when the device temperature changes from 25° C. to 125° C. The change is quite small (about 0.0002 GHz). FIG. 2 illustrates that the change in center frequency can be compensated by changing the applied voltage from 3 volts to 2.1 volts. This change in applied voltage shifts the center frequency back to that center frequency at the operating temperature of 25° C. Thus FIG. 2 is an example of how the tuning layer can be used as a temperature compensating mechanism for the device.

In terms of circuit design, the rapid change in the acoustic path length of the paraelectric material provides a device with a very high bandwidth due to the rapid response time. In practical operation, the circuits that apply the bias to the paraelectric material will actually limit the bandwidth of the change of state due to the rapidity with which the path length through the paraelectric material changes in response to a change in bias voltage.

It will be appreciated that, since the acoustic path length has a nearly instantaneous response to the bias voltage, the bias voltage may itself be time-varying. Accordingly, the term "DC bias" used herein should be understood as "varying with a lower frequency than the incremental signal." As discussed in more detail below, the incremental signal in many useful devices has a frequency in the RF or at least an IF (e.g., 500 MHz to 1 GHz) range.

Figure 3A:
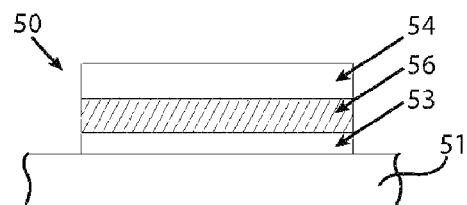
FIGS. 3A and 3B illustrate thin film structures in which a device including a paraelectric crystal layer is formed on a substrate, in accordance with an embodiment of the invention.
Figure 3B:
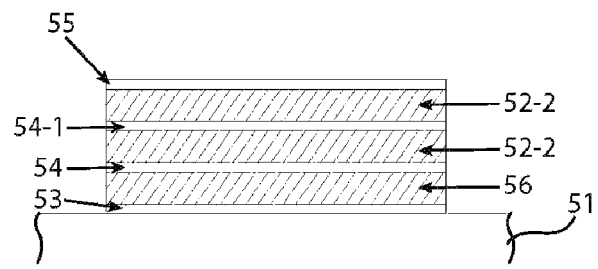

The devices described above may be fabricated using thin-film deposition and processing techniques familiar to those skilled in the art. (The term "thin film" refers to a layer of material having a thickness of less than about 50 μm.) A typical sequence for assembly of a thin-film embodiment of a paraelectric transducer device 50 is shown in FIGS. 3A and 3B. Referring first to FIG. 3A, a bottom electrode 53 is formed on substrate 51, with piezoelectric layer 56 and top electrode 54 formed successively thereon. Referring to FIG. 3B, a plurality of stacked paraelectric layers is formed on top of electrode 54. The plurality of paraelectric layers 52-1 and 52-2 are bounded by electrodes 54, 54-1 and 55. It should be noted that in a multilayer device such as in FIG. 3B, the biasing of each layer may be controlled separately. Accordingly, the electromechanical transduction is controlled using electrodes 53 and 54 and the acoustic path length is controlled using electrodes 54, 54-1 and 55. Furthermore, the spatial distribution of the overall biasing of the device (e.g. voltage difference between electrodes 53 and 55) may be varied by selecting the bias applied to the intermediate electrodes 54 and 54-1. The gradient of the polarization of the paraelectric material may thus be controlled, so that different parts of the same device can exhibit different piezoelectric properties. The bias may also be varied to compensate for variations in manufacturing of the device.

Figure 3C:
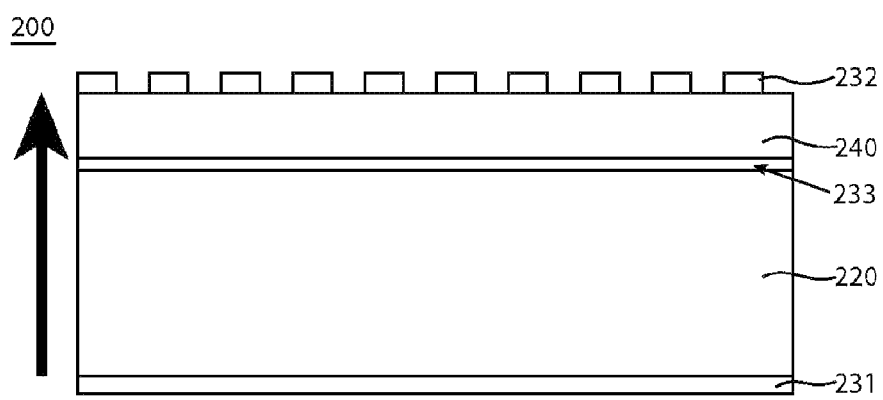
FIG. 3C illustrates a thin film structure having paraelectric crystal tuning and piezoelectric transduction layers and a patterned top electrode, in accordance with an embodiment of the invention.

A tunable thin-film device 200, in accordance with another embodiment of the invention, is shown in FIG. 3C. This device has separate tuning and transduction layers 240, 220 with a bottom electrode 231 underlying the transduction layer 220 (e.g. AlN). The bottom electrode may be in contact with the substrate, or alternatively in contact with a reflector structure or suspended over the substrate, as discussed herein. The transduction layer 240 has a higher dielectric constant that the tuning layer 220. Electrode 233 is interposed between transduction layer 220 and tuning layer 240. The top electrode 232 is patterned to form a plurality of electrode areas, all shorted together. The geometry of the pattern can be altered as necessary. The purpose of the patterning is to effect a none-time alteration of the effective mass-load, and hence the acoustic path of the resonator. The patterned electrode can provide a gross shift in the center frequency of the device 200. This is a one time shift and does not provide for tuning the device during operation.

Figure 4A:
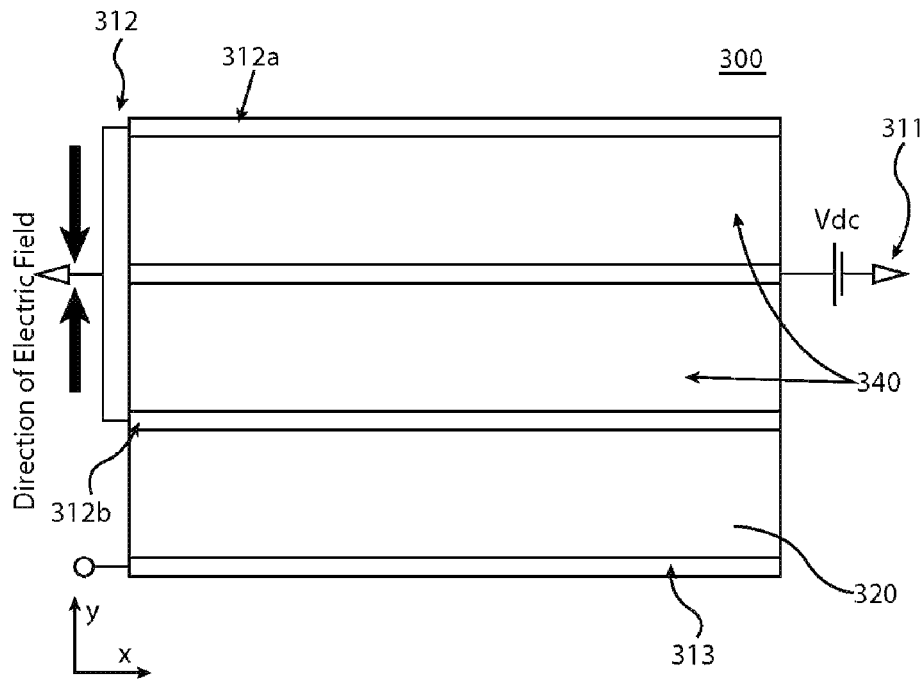
FIGS. 4A-4B are schematic cross-sectional views of resonator devices having two, three or more paraelectric layers respectively.
Figure 4B:
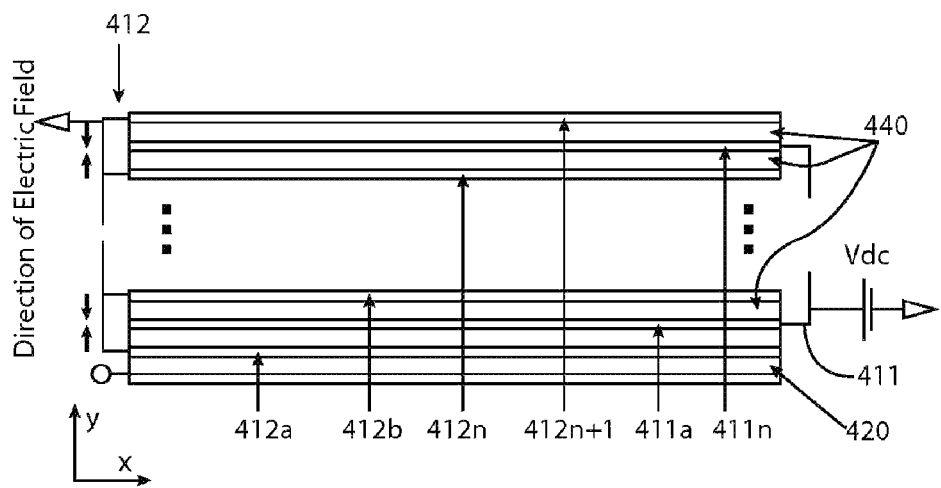

An acoustic resonator embodying the invention may be formed of on transduction and two, three or more tuning layers, as shown in FIGS. 4A, and 4B respectively. In certain embodiments, it is advantageous to divide the tuning layer into a plurality of layers separated by electrodes. As noted above, if the device is to be deployed and used in a low voltage environment, it is advantageous if the tuning layer is thin (e.g. a thickness of 50 µm or less) in order to obtain the desired rapid (i.e. virtually instantaneous) response from the tuning layer. However, the particular application may call for an aggregate thickness of the tuning layer that exceeds the thickness at which the desired response can be obtained at lower voltage. A solution is to divide the tuning layer into multiple thin layers, each having the desired thickness. Each individual layer is sandwiched by two electrodes. The direction of the electric field provided by the device is illustrated in the Figures. FIG. 4A is a schematic cross-sectional view of a two-layer tuning layer 340. In this embodiment, the electrode 312 is divided between two layers. Layer 312a is interposed between transduction layer 320 and tuning layer 340. Layer 312b is formed on the top layer of tuning layer 340. Electrode 312 is connected to ground. Electrode 311 is interposed between the two individual layers that make up tuning layer 340 and is also connected to ground. The electrodes are arranged in the stack so that each layer of 340 is biased in an alternating direction; that is, electrodes 311 are between electrode portions 312a and 312b. Electrode 313 is formed beneath transduction layer 320 and electrodes 312a and 313 are used to bias transduction layer 320.

As previously noted, the electric field is the stress that induces the change in acoustic path length in the tuning layers 340. Controlling the electric field controls the acoustic path length of the tuning layers 340, which in turn adjusts the center frequency of the device 300. Since the electric field is the ratio of bias voltage to thickness, only a very small electric field is obtained when the tuning layer is thick at small operating voltages. As noted above, it is advantageous if the devices are integrated on integrated circuit chips. As such, it is desired for the devices to operate in the range of 3 to 5 volts. However, if the thickness of the tuning layer is 50 microns, this provides a field of only 0.06 volts/µm to 0.1 volts/µm, which is insufficient for tuning purposes. In this example, it is advantageous if the thickness of layers 340 is 20 µm, in which case the field for devices with an operating voltage of 3 to 5 volts is in the range of 0.15 to 0.25 volts/µm. In the example where the thickness of the layers 340 is reduced to 10 µm, the field is further increase to 0.3 volts/µm to 0.5 volts/µm for operating voltages in the range of about 3 volts to about 5 volts.

As shown in FIG. 4B, a resonator having an arbitrary number of transduction/tuning layers 440, interspersed with one or the other of electrodes 411 and 412, may be arranged in this fashion. Specifically, tuning layer 440 is divided into x layers. Each individual layer of tuning layer 440 is sandwiched between a first electrode 412 and a second electrode 411. The direction of electric field for electrodes 312 is in one direction and the direction of the electric field for the second electrode is in the opposite direction.

Figure 5:
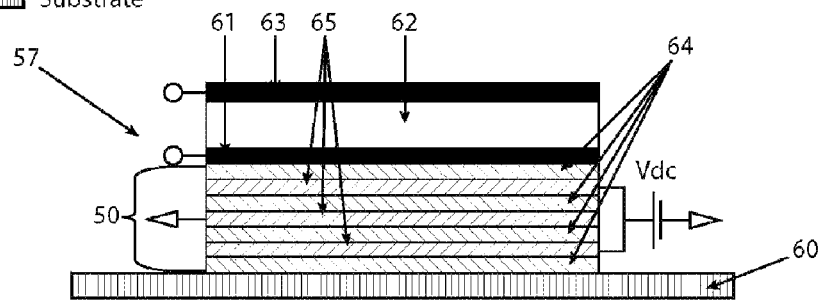
FIG. 5 is a schematic illustration of a thin-film device including a protective layer and a reflector.

In general, it is desirable to build a thin-film device on a substrate so that it is protected both from above and below. In particular, if the device is an acoustic resonator, it is desirable to provide both physical protection and acoustic isolation. A thin-film device as described herein may be protected using an air gap, a capping layer, a Bragg reflector or a combination thereof. The device (which may be viewed as a stack of paraelectric/dielectric/piezoelectric layers and electrodes) may have a released-layer structure in which the stack is formed on a thin film in contact with the substrate, and the thin film is subsequently removed to create an air gap. Alternatively, the device may have a solidly mounted resonator (SMR) structure, in which case it is desirable to provide acoustic isolation using an isolator structure between the substrate and the stack, such as a Bragg reflector. FIG. 5 is a schematic illustration of a thin-film device 57 (e.g. an acoustic resonator) overlying a Bragg reflector 50 formed on a substrate 60 and covered by a capping layer (not shown). In this embodiment, the substrate 60 can be a rigid silicon substrate because the Bragg reflector 50 prevents the substrate from functioning as an acoustic sink. The Bragg reflector has at least one layer of material that has an adjustable acoustic path length in response to the application of a DC bias thereto. In the illustrated embodiment, the Bragg reflector has a plurality of such layers. The tunable material 64 is incorporated into the Bragg reflector 50. A Bragg reflector 50 is a thin-film stack having alternating high- and low-impedance thin film materials, each with a thickness equal to a quarter acoustic wavelength in the corresponding material. Since the impedances are mismatched at each interface, reflections take place at each interface. Accordingly, acoustic energy loss through the stack is minimized. In this embodiment, Bragg reflector 50 is a plurality of tuning layers 64 (a low acoustic impedance material such as $SrTiO_3$) alternating with layers having a high acoustic impedance (e.g. tungsten (W)). The high acoustic impedance layers 65 are connected to ground and serve as the electrodes to bias the tuning layers 64. The direction of the field is illustrated at the left of the device. The device is operated by biasing the transduction layer 62 using electrodes 61 and 63. Electrode 61 and high acoustic impedance layers 65 serve to bias the individual tunable layers 64. Applying a DC bias to alternate layers 65 allows one to shift the acoustic velocity of the $SrTiO_3$ layers, and hence their center frequency.

The Bragg reflector is placed between the device and the substrate 60, so that energy loss to the substrate is minimized. In an alternate embodiment a second Bragg reflector (not shown) may also be advantageously located between the transduction layer 62 and the capping layer. The capping layer is typically an insulator, but may itself be covered by a conducting solder seal cap or aluminum cap. Alternatively, device 57 may be isolated using an air gap between the device and the capping layer. The capping layer may also be a multilayer thin film structure with high strength and stiffness to provide effective mechanical protection for the device, as detailed in international patent publication WO2004/077523, the disclosure of which is incorporated by reference. In addition, the device 57 may be encapsulated in an air space covered by a capping layer, with the capping layer supported by pillars as detailed in international patent publication WO2004/055885, the disclosure of which is incorporated by reference. For a structure with a double Bragg reflector, see the aforementioned U.S. Ser. No. 12/002,524 entitled "INTEGRATED ACOUSTIC BANDGAP DEVICES FOR ENERGY CONFINEMENT AND METHODS OF FABRICATING SAME."

Figure 6A:
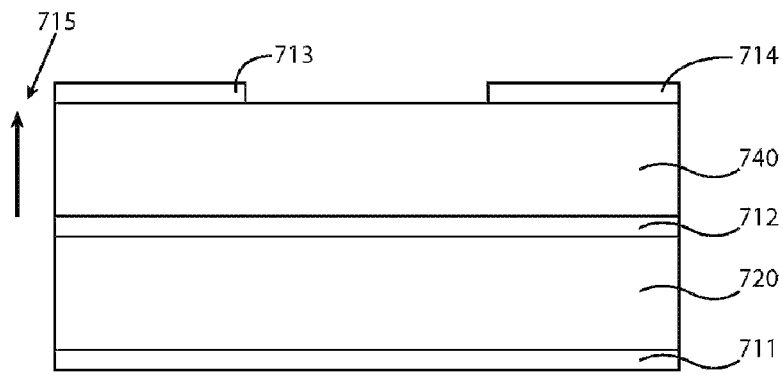
FIGS. 6A and 6B illustrate a coupled resonator filter (CRF) including a layer of piezoelectric material and tunable paraelectric crystal layers, in accordance with an embodiment of the invention.
Figure 6B:
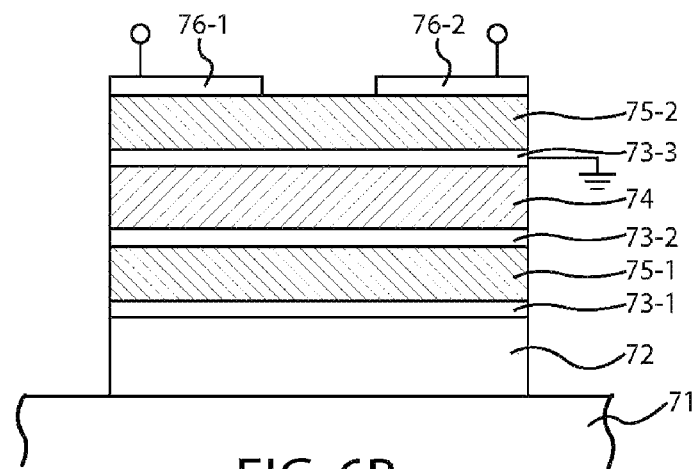

A stacked-layer thin film device incorporating paraelectric material may be configured as a bulk acoustic wave (BAW) resonator, as shown in FIGS. 6A and 6B. FIG. 6A is a schematic cross-section view of a coupled resonator filter (CRF) with paraelectric transduction/tuning layers 720, 740. Electrode 712 between the layers is a biasing electrode, while the bottom electrode 711 is floating. In this example, the biasing is such that electric fields 715 are present in the paraelectric layers. Two separate electrodes 713, 714 are disposed on top of layer 740 and serve as RF input and output ports respectively.

FIG. 6B illustrates another arrangement of a CRF, including a stack of layers formed on a substrate 71 (which in this embodiment can be a rigid substrate) with a set of isolation reflectors 72 separating the device from the substrate. The reflectors 72 prevent the substrate from acting as an acoustic sink. The device includes a tunable paraelectric crystal layer 74 and piezoelectric layers 75-1, 75-2 above and below the paraelectric layer. The paraelectric layers are separated by metal electrodes 73-1, 73-2, 73-3; the device is isolated from the substrate 71 by a stack of isolation reflectors 72. The top metal electrode layer is divided into two electrodes 76-1 and 76-2 to form input and output ports. In this arrangement, the tunable layer 74 serves as a variable acoustic delay line.

It will be appreciated that, in a device having at least two stacked paraelectric layers, different tuning voltages may be used to vary the electromechanical coupling in the respective layers. Accordingly, the acoustic resonance of the device may be tuned and the ratio of input impedance to output impedance may be simultaneously adjusted. This approach may be used in a device having any number of layers, as long as separate input and output ports are provided (as shown in FIG. 6B). Furthermore, in a device having at least two acoustically tunable layers, where at least one of those layers is also a biased electromechanical transducer, the combination of tuning voltages may be adjusted to permit tuning of both the series resonance and the parallel resonance of the device.

Figure 7:
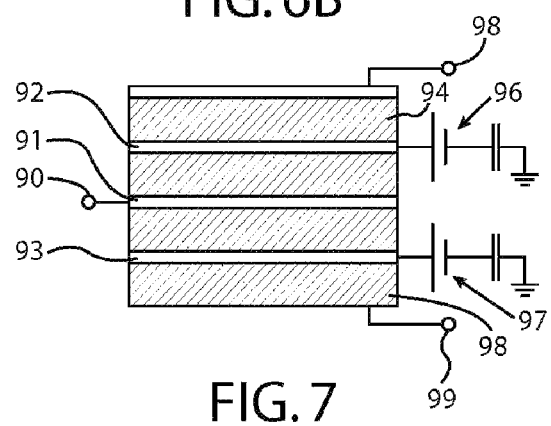
FIG. 7 illustrates a device including a plurality of stacked tunable paraelectric crystal layers arranged in a filter/baluns combination structure, in accordance with an embodiment of the invention.

In another embodiment of the invention, a device with four stacked, tunable paraelectric crystal layers may be used to create a filter/baluns combination structure, as shown in FIG. 7. The middle electrode 91 is coupled to the input 90. The other interior electrodes 92, 93 are AC coupled to ground, but have DC biasing 96, 97 in opposite directions with respect to the input signal. Acoustic waves in the device are therefore launched in phase. Differential outputs 98, 99 are obtained by providing opposite DC bias on the outer paraelectric layers 94, 95, so that their conversion from mechanical to electrical energy is opposite in sign.

Figure 8:
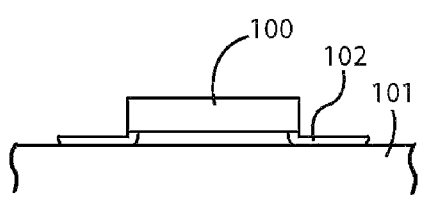
FIG. 8 is a schematic illustration of a device suspended above a substrate using the metal electrical leads of the device, in order to obtain acoustic isolation for the device.
Figure 9:
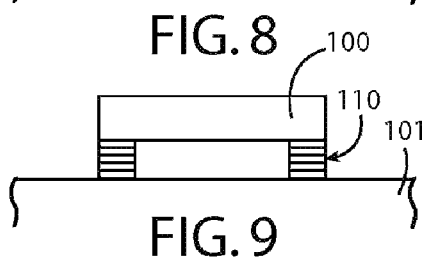
FIG. 9 is a schematic illustration of a device supported at its edges using metal-insulator-metal (MIM) beams, in order to obtain acoustic isolation for the device.

As noted above, there are many different design choices to provide the thin film device with the desired acoustic isolation. FIG. 8 illustrates a device 100 suspended over substrate 101, supported by the metal leads 102 making electrical connection to the device. This arrangement serves to attenuate acoustic losses from the device to the substrate. Another acoustic isolation arrangement is shown in FIG. 9. Device 100 is supported at its edges using metal-insulator-metal (MIM) beams 110. This generally provides stiffer suspension over substrate 101, and therefore permits easier handling and removal of the device.

Figure 10A:
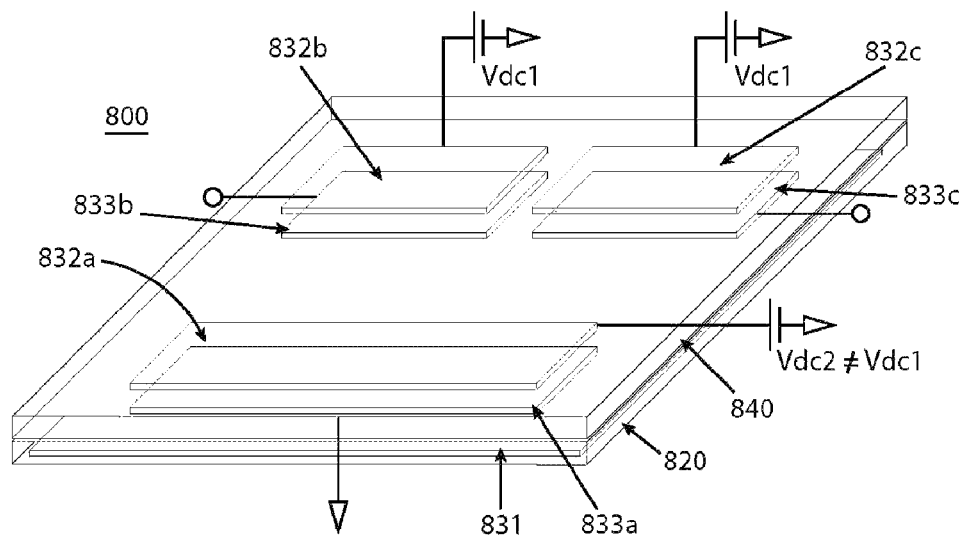
FIGS. 10A-C is an embodiment of the invention in which the thin film structure is configured as a ladder filter structure.

In one embodiment, illustrated in FIG. 10A, the thin-film device is configured as a ladder filter 800. The filter 800 is supported by a substrate (not shown). The substrate is configured so as not to act as an acoustic sink to the filter 800. The filter is formed on a common electrode 831 over which is formed a thin transduction (e.g. piezoelectric) layer 820. Three patterned electrodes 833a, 833b and 833c are formed on the transduction layer 820. The transduction layer is interposed between the common electrode 831 and the three patterned electrodes 833 a-c. A thin film of tunable layer 840 is formed over the transduction layer 820 with patterned electrodes 833 a-c formed thereon. Patterned electrodes 832 a-c, commensurate in shape and placement with electrodes 833 a-c, are formed on tunable layer 840.

The problem solved by this device is understood by referring to FIG. 102. In prior art devices, the transduction layer 820 is sandwiched between common electrode 831 and patterned electrodes 833 a-c. While electrodes 833b and 833c are the same thickness, the electrode 833a in prior art devices is required to be substantially larger in order to shift the center frequency of the device downward. Making the electrode 833a thicker than electrodes 833b and 833c is difficult from a manufacturing perspective as it requires separate patterning/deposition steps, making the device much more expensive to manufacture.

Figure 10B:
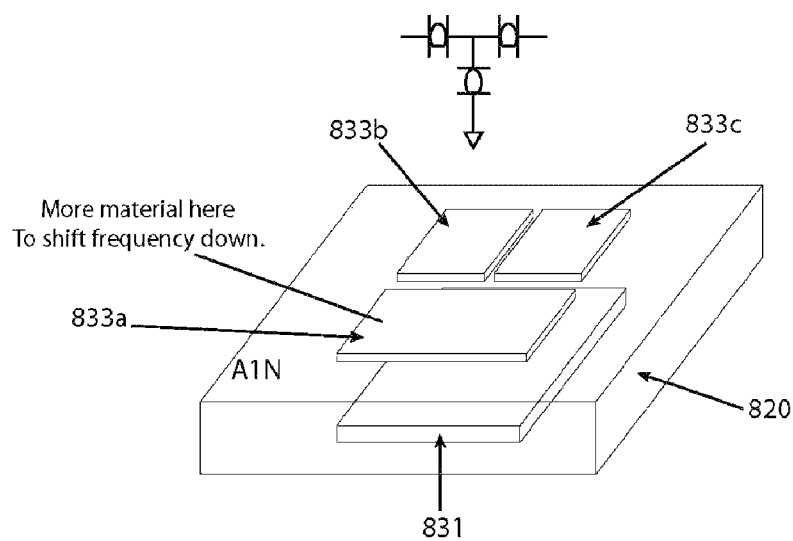
Figure 10C:
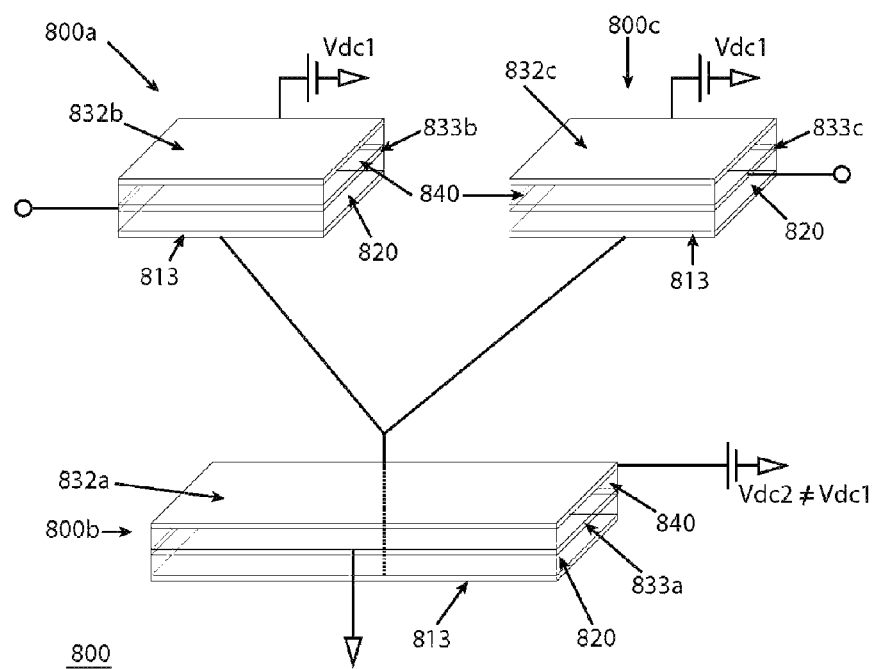

In the device of the present invention, the center frequency of the device is adjusted by controlling the bias to shunt portion defined by electrodes 832a, 833a. The operation of the device is best understood with reference to FIG. 10 C. The device is illustrated as three separate device portions without illustrating the entirety of common electrode 831, transduction layer 820 or tuning layer 840. Device portion 800a is referred to as the filter "in" portion and device portion 800c is referred to as the filter "out" portion. Device portion 800b is referred to as the shunt filter portion. In operation, the electric field of the shunt portion of the device 800b is illustrated in the downward direction while the do bias voltage of the shunt portion electrode 832a is illustrated as not equal to the dc bias voltage of the in and out electrodes, 832b-c, respectively. By providing a different bias to the shunt portion 800b, the center frequency of that portion of the device is shifted without requiring that the shunt electrodes 832a, 833a have a different thickness than the other electrodes (832b-c, 833b-c).

As mentioned above, devices according to the invention may have a time-varying bias voltage. In particular, in a resonator device the electromechanical coupling may be chopped—that is, the coupling may be turned on and off at a given frequency. The signal (small amplitude) would then be added to the bias (relatively large amplitude) and applied to the resonator. For example, the bias voltage may be supplied by a square-wave oscillator at a frequency f1, with a small-amplitude input signal at a frequency f2. Mechanical energy would then be generated at frequencies f1, f2, f1+f2, f1−f2, 3f1−f2, f2−3f1, etc. If the resonant frequency of the device was designed to be, for example, at f1−f2 (alternatively, at f1+f2), then the device would function both as a mixer and a filter.

A variety of practical devices may be constructed using paraelectric transducers, filters and resonators in accordance with the invention. These include radio receivers; microwave components (e.g. resonators, RF and IF filters, mixers, and varactors); sensors (e.g. strain gauges, pressure/temperature sensors, and inertial, acceleration, vibration and shock sensors) and actuators. In general, any device employing piezoelectric transduction may be improved, owing to the numerous advantages of biased, tunable paraelectric crystal media over piezoelectric crystal media. Devices constructed according to the invention have no moving parts and negligible microphonic effects; selectively enabled transduction (no transduction in the off state, in the absence of bias); selectable direction and gradient of polarization; nearly instantaneous transduction and tuning; good off-state isolation; no memory effect (repeated biasing and de-biasing does not degrade performance); operate over a broad temperature range (suitable for automotive applications); and generally have lower impedance than devices built using other methods.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A device comprising:
    a substrate
    a piezoelectric layer and a tunable layer overlying and supported by the substrate, and
    a means for biasing the tunable layer;
    wherein the tunable layer has an acoustic behavior over an operating temperature range under a condition of relatively low applied bias that is substantially different than its acoustic behavior under a condition of relatively high applied bias,
    wherein the piezoelectric layer and the tunable layer are each formed as a thin film over said substrate,
    wherein the tunable layer has a highly field-polarizable and lattice-deformable, substantially centrosymmetric structure over an operating temperature range under a condition of relatively low applied bias, and a substantially non-centrosymmetric structure over said operating temperature range under a condition of relatively high applied bias,
    wherein the dielectric permittivity constant of the tunable layer is at least 100 at low applied bias,
    wherein the tunable layer is close to its ferroelectric instability but remains paraelectric throughout the operating temperature range of the device when the device is under the condition of relatively low applied bias, and
    wherein the phase transition temperature from paraelectric to ferroelectric state is just below the operating temperature range of the device, the phase transition temperature range being between approximately 150 kelvins and 200 kelvins.

2. A device according to claim 1, wherein the applied bias is selected from the group consisting of an electric field applied across the tunable layer, a magnetic field applied across the tunable layer, a mechanical stress applied across the tunable layer, a mechanical strain applied across the tunable layer, and a temperature applied across the tunable layer.

3. A device according to claim 1, wherein the applied bias is substantially constant over time.

4. A device according to claim 1, wherein the applied bias varies over time.

5. A device according to claim 1, wherein the applied bias varies periodically over time.

6. A device according to claim 1, wherein the applied bias is distributed over the tunable layer in accordance with a predetermined pattern, and the acoustic path length has an associated magnitude corresponding to the predetermined pattern.

7. A device according to claim 6, wherein the applied bias has a predetermined gradient in selected regions of the tunable layer in accordance with the predetermined pattern, and the acoustic path length has an associated magnitude gradient corresponding to the predetermined gradient.

8. A device according to claim 1, wherein the device has an outer edge and further comprising an edge support contacting the outer edge and separating the device from the substrate.

9. A device according to claim 8, wherein the edge support is a metal-insulator-metal (MIM) structure having a plurality of metal layers and a plurality of insulator layers.

10. A device according to claim 1, wherein the device has a plurality of layers, the tunable layer comprising at least one of said layers, and at least one other of said layers is of a material different from that of the tunable layer.

11. A device according to claim 10, wherein said layers include at least one of a dielectric layer and a piezoelectric layer.

12. A device according to claim 1, wherein the means for biasing comprises a plurality of electrodes overlying the substrate, wherein
    each pair of electrodes having the tunable layer disposed therebetween to form a stack of alternating electrodes and layers of the tunable layer,
    one of the electrodes is a bottom electrode at a bottom of the stack in contact with the substrate, and
    another of the electrodes is a top electrode at a top of the stack.

13. A device according to claim 12, wherein the bottom electrode and the top electrode are adapted to receive an applied electric potential.

14. A device according to claim 12, wherein each of the electrodes in the stack is adapted to receive an applied electric potential, so that potential differences can be independently applied across respective layers of the tunable layer in the stack.

15. A device according to claim 12, wherein, in response to the applied bias, the device is an electromechanical transducer.

16. A device according to claim 15, wherein the bias is selected from the group consisting of an electric field applied to the stack, a magnetic field applied to the stack, a temperature gradient applied to the stack, and a pressure gradient applied to the stack.

17. A device according to claim 15, wherein a sign of electromechanical transduction performed by the device is selectable in accordance with placement and magnitude of the bias.

18. A device according to claim 15, wherein a polarization gradient in the device is variable in accordance with a spatial distribution of the bias.

19. A device according to claim 15, wherein the acoustic path length of the tunable layer is variable in accordance with variation of the bias.

20. A device according to claim 15, wherein the device has a resonant frequency which is variable in accordance with variation in the bias.

21. A device according to claim 20, wherein one or more of the respective layers of the tunable layer is responsive in said operating temperature range to potential differences resulting from electric potentials applied to the electrodes, to effect selectively tunable mechanical resonances of said layers.

22. A device according to claim 21, wherein the device has a primary resonance mode.

23. A device according to claim 21, wherein the device has a primary resonance in one of a thickness mode, a lateral mode, a shear mode, an extensional mode, a radial mode, a breathing mode, and a wineglass mode.

24. A device according to claim 23, wherein the device has a primary resonance in an extensional mode, and said extensional mode is one of a thickness extensional mode, a length thickness extensional mode, and a rotated thickness extensional mode.

25. A device according to claim 20, wherein electromechanical transduction and tuning of the resonant frequency are performed in separate tunable layers.

26. A device according to claim 20, wherein electromechanical transduction and tuning of the resonant frequency are performed in a single tunable layer.

27. A device according to claim 1, wherein:
the means for biasing comprises a plurality of electrodes overlying the substrate, and wherein the
device further comprises a layer of dielectric material overlying the substrate, wherein:
each pair of electrodes has a layer of either the tunable layer or the dielectric material disposed therebetween to form a stack of alternating electrodes and layers of the dielectric material or tunable layer,
each pair of electrodes which has a layer of the dielectric material disposed therebetween is disposed between a pair of layers of the tunable layer,
one of the electrodes is a bottom electrode at a bottom of the stack in contact with the substrate, and
another of the electrodes is a top electrode at a top of the stack.

28. A device according to claim 27, wherein each of the electrodes in the stack is adapted to receive an applied electric potential, so that potential differences can be independently applied across respective layers in the stack.

29. A device according to claim 1, wherein:
the tunable layer includes a plurality of regions, and
each of said regions has a substantially centrosymmetric structure over an operating temperature range under a condition of relatively low applied bias, the tunable layer being characterized as paraelectric under the condition of relatively low applied bias, and
a substantially non-centrosymmetric charge structure over said operating temperature range under a condition of relatively high applied bias, the tunable layer being characterized as piezoelectric under the condition of relatively high applied bias.

30. A device according to claim 29, wherein in a given region, under the condition of relatively high applied bias, the tunable layer has piezoelectric polarization in a direction associated with the applied bias.

31. A device according to claim 1, wherein the tunable layer is a perovskite crystal.

32. A device according to claim 31, wherein the perovskite crystal is selected from the group consisting of barium strontium titanate ($Ba_xSr_{1-x}TiO_3$), lead strontium titanate ($Pb_xSr_{1-x}TiO_3$), strontium titanate ($SrTiO_3$), potassium tantalate ($KTaO_3$), calcium titanate ($CaTiO_3$), barium zirconium titanate ($Ba_xZr_{1-x}TiO_3$), barium titanate stanate ($BaSn_xTi_{1-x}O_3$), potassium tantalate niobate ($KNb_xTa_{1-x}O_3$) and rubidium potassium niobate ($Rb_xK_{1-x}NbO_3$).

* * * * *